April 7, 1953 G. A. BONADIO 2,634,339

AUTOMATIC DISTORTION CONTROL

Filed Oct. 22, 1949

INVENTOR.
GEORGE A. BONADIO
BY Roger Williams
ATTORNEY

Patented Apr. 7, 1953

2,634,339

UNITED STATES PATENT OFFICE 2,634,339

AUTOMATIC DISTORTION CONTROL

George A. Bonadio, Watertown, N. Y.

Application October 22, 1949, Serial No. 123,073

6 Claims. (Cl. 179—171)

This invention relates to circuits and a method for controlling and minimizing distortion in electronic amplifier apparatus.

One purpose of this invention is to provide means for the automatic reduction of distortion occurring in one or more stages of an electronic amplifier.

Another purpose of this invention is to provide an electronic amplifier in which the means usually employed to secure automatic volume control, expansion or compression, are modified and so connected to other elements, that they will respond only to the particular current produced when distortion occurs, rather than responding to normal output currents, although the invention may be modified to permit response to both types of current.

Still another purpose of this invention is to provide, in apparatus of the type described, means whereby manually actuated volume controls may be turned to positions of maximum volume, without the possibility of substantial distortion occurring in the amplifier.

Yet another purpose is to allow the volume controls just referred to, to be kept at all times in positions near or at the highest level of sound, and yet to avoid the occurrence of a noticeable degree of distortion.

A further purpose of this invention is to allow volume expansion or contraction to be employed in an electronic amplifier to any desired degree, without the possibility of the power-handling capacity of such amplifier being exceeded, and furthermore to provide means whereby such expansion or contraction is automatically controlled so that it may function to as great extent as desired, and yet so that the degree of such functioning shall automatically be determined by the occurrence of incipient distortion in such amplifier.

Further objects and advantages of this invention will become apparent to those skilled in the art, from the following specification, and from the hereunto annexed drawings.

Figure 1:
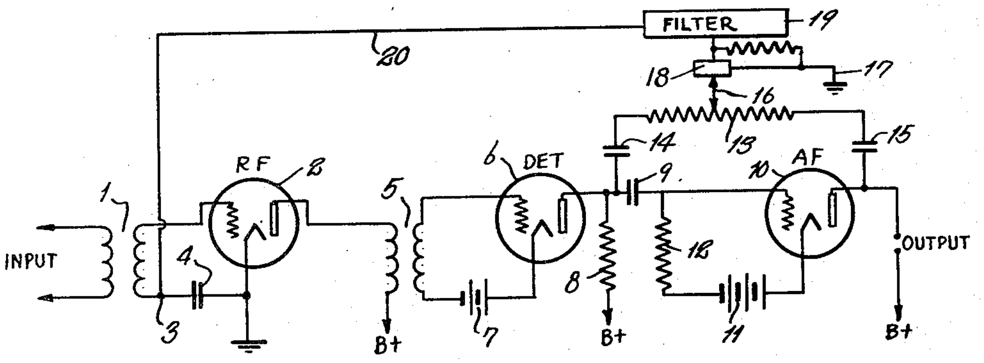
Fig. 1 is a schematic diagram showing this invention applied to a portion of a radio receiver.

Referring now to Fig. 1, an input transformer 1 feeds radiofrequency energy from the input to a tube 2, the potential of the control grid of which is determined at the point 3, in a manner hereinafter to be described.

The elements of this tube, and of all tubes subsequently described are illustrated by conventional symbols, so that detailed description thereof is deemed needless. While such tubes have been herein shown and described as triodes, it is to be understood that multielement tubes may be employed without changing the operation of this invention, and the circuit changes necessary for such multielement tubes will readily be apparent to one skilled in the art.

In the case of tube 2, an isolation or by-pass capacitor 4 serves to isolate the control grid, so that the potential of point 3 may be altered. The output of tube 2 feeds, via transformer 5, a detector tube, here shown as of the anode-rectification type, a battery 7, of suitable potential for securing this type of rectification being shown, it being also understood that while batteries have here been shown for the supply of grid and anode potentials, it is possible to substitute for such batteries the potential drop across resistors, as familiar to those skilled in the art. Likewise other forms of detection may be used, or rectified A. C.

The output of tube 6 is coupled via anode resistor 8 and capacitor 9 to the input electrode of audio tube 10, of which latter the input grid has its static or no-signal potential determined by a battery 11, feeding it via coupling resistor 12. The output of tube 10 may actuate any desired type of transducer, such as a loudspeaker (not shown). The entire amplifier, up to this point, is of conventional type, as used with automatic volume control, and various alterations and modifications thereof are possible without affecting the circuits of this invention, which are ancillary to those circuits already described.

The circuits and apparatus upon which this invention is founded are in the nature of a potential bridge connected between the output or input of a given tube and a point farther along the amplifier, which latter point carries a signal wave greater in amplitude than the point to which the first mentioned end of the bridge is connected, but yet having substantially the same wave form, except upon the occurrence of distortion in the amplifier. This potential bridge is so balanced, when functioning purely for distortion limiting, that at one tapped point thereof there will be substantially zero potential, with respect to the reference potential of the system, when the input and output wave forms of the bridge are of identical shape, and the relative magnitudes thereof remain constant.

In the drawings, the bridge is constituted by resistor 13, coupled, via two potential isolating capacitors 14 and 15, to the respective anodes of tubes 6 and 10, which normally carry identical wave forms, as to shape, but of differing magnitudes. Adjustable contact 16 may then be placed at a position where the integrated audiofrequency potential developed thereat with respect to the ground 17 will normally be null. Tube 2 has the cathode thereof at ground potential, with respect to signal voltages, it being understood that any suitable means, such as resistors or batteries may additionally be employed to bias tube 2 at any desired static grid-cathode potential, suitable for normal operation of this tube, when no distortion occurs.

This bridge has for the first arm the portion of resistor 13 lying between contact 16 and the extremity of the resistor which is connected to capacitor 14, for the second arm the portion of resistor 13 lying between contact 16 and capacitor 15, for the third arm the total effective resistance between the lower armature of capacitor 14 and the earth, this comprising in Figure 1 the anode load resistor 8 and the effective output anode-cathode circuit of electronic tube 6, and for the fourth arm the similar total effective resistance between the lower armature of capacitor 15 and earth, via the anode of tube 10 and the output load thereof. The cross arm of the bridge is comprised by the circuit through rectifier 18 and rectifier load resistor 18′ to earth and back from earth to the respective cathodes of electronic tubes 6 and 10, and to the respective loads thereof. The capacitors 14 and 15 are so chosen that the respective impedances thereof shall be substantially equal at all frequencies to which the bridge is subjected, these isolation capacitors thereby being rendered virtually ineffective as to exerting any influence upon the balance or imbalance of the bridge. In the case of the embodiment of applicant's invention shown in Figure 3, the third arm of the bridge comprises substantially the impedance reflected by transformer 23 from the anode circuit of electronic tube 6, but otherwise the bridge circuit remains substantially identical with that previously detailed.

Under conditions of operation when no distortion occurs, the potentials fed respectively across the third and fourth arms of the bridge bear to one another a ratio correspondent to the effective amplification yielded by electronic tube 10, this being in turn a function of the $\mu$ of the tube. This means that upon resistor 13, contact 16 may be placed at such position that flow of current in the cross arm of the bridge shall be substantially null. This specific method of balancing out two potentials which are variable but which always bear to one another a constant ratio is so extremely old in the art, having been used for at least 30 years, and so familiar to one versed therein that it is considered that further elaboration upon the action of this elementary type of alternating current bridge would be superfluous.

The occurrence of distortion means that the instantaneous potentials impressed upon the bridge by the wave forms of the respective input and output currents of electronic tube 10 no longer bear to one another the substantially constant ratio above described, thereby bringing it about that the position of contact 16 would of necessity, for a condition of balance, be subject to rapid change from one position to another position, as the ratio of input and output potential underwent variation, but since the position of contact 16 is not capable of such hypothetical rapid alteration, upon the occurrence of the described distortion and change of wave form, then it thereby inevitably follows, since the position actually assumed by contact 16 and the theoretical position corresponding to balance of the bridge do not coincide, that, over a finite period of time, occurrences of conditions of imbalance of the bridge will cause current flow via the cross arm thereof and will thereby establish a unidirectional potential across resistor 18′.

When distortion happens, the two wave forms fed to the extremities of resistor 13 are no longer identical in shape. Therefore a distortion voltage will appear at point 16, which is no longer in balance. The current due to this voltage is rectified at 18, filtered at 19, and fed to control point 3 via conductor 20. It is to be understood that if the magnitude of this voltage be too low for effective control, it may be amplified in any conventional manner, before rectification thereof. The effectiveness of amplification in tube 2 is a function of the control grid potential thereof, as well understood in the art of automatic volume control. Therefore phasing of all circuits is so made that increasing distortion will yield at point 3 a voltage which increasingly reduces the amplification of tube 2. Thereby the distortion becomes self-limiting. By setting tap 16 at a point not precisely in balance, it will be possible to cause control voltages to be developed and applied to control point 3, even when only normal amplification occurs, thus allowing automatic volume control of conventional type to be simultaneously secured. In this last fashion, my invention can perform the dual functions just described, i. e. it can act both as automatic volume control and as distortion limiter, since the potentials developed at point 16 may be made a function both of normal signal volume and of distortion, by suitable unbalance of the bridge.

Additionally to the combination action just described, it is also possible to make the value of resistor 13 suitable for inverse feedback action, which is often desirable when tube 10 is of the multielement type. This action of a resistor so coupled is well known in the art, so that further explanation thereof is thought needless.

The particular electrical values of the elements of the circuits of my invention are capable of wide variation, according to the constants of the tubes and of the other elements employed. For distortion control only, resistor 13 is usually between 1 and 10 megohms. Isolation capacitors 14 and 15 are usually greater than 0.01 mfd., but may be made very much larger, especially if the resistor value be made less than 1 megohm, which it may conveniently be, in order to accomplish inverse feedback, as above described. In general, resistor 13 is usually at least 50,000 ohms, or thereabouts, and the product of capacitance and resistance is preferably kept between 1,000 and 100,000. The setting tap of 16 may be made by ear, to a point yielding the loudest signals, when the amplifier is working at a high gain level.

Figure 2:
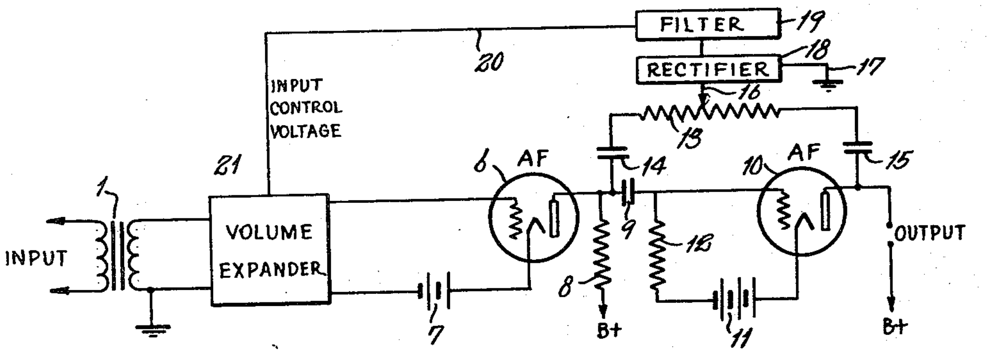
Fig. 2 is a diagram of this invention applied to an audio amplifier of the volume expander type.

In Fig. 2, an audio amplifier is shown controlled by a volume expander 21, which may alternatively be a volume compressor without changing the modus operandi of the invention. The distortion limiter is connected exactly as in the circuit of Fig. 1, except that the control potential derived therefrom is now used to govern the degree of effectiveness of expansion or contraction, as will be apparent to those skilled in the art. In this case, of course, the degree of amplification is controlled by means other than pure grid bias. Such volume expanders are well known in the art, so that detailed description thereof herein would be superfluous.

Figure 3:
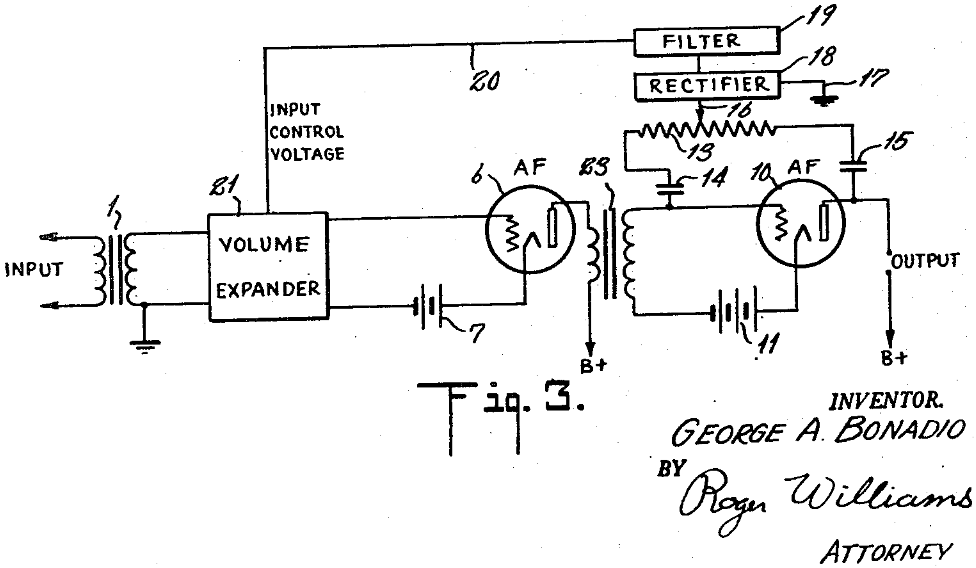
Fig. 3 is a diagram showing this invention applied to an audio amplifier of the transformer-coupled type.

In Fig. 3, an amplifier similar to that of Fig. 2 is shown, but using transformer coupling to the bridged tube. In this case, the bridge is coupled at one end to the anode of tube 10, as in previous forms. The other end of the bridge is coupled via isolation capacitor 14 directly to the grid input of tube 10, thereby assuring correct phasing of the bridge. Transformer 23 is used to couple tube 10 to the previous tube, rather than using a resistance-capacity network for this purpose. The operation of this form of my invention is substantially as already described in connection with Fig. 2.

In addition to the controls already described, manual volume controls may be applied to any of these amplifiers. Likewise the control of this invention may be applied to bridge any one or more tubes of an amplifier, and is not restricted to the final tube, as here indicated, although the final tube is usually preferable, because of the higher control voltages there available.

While the output of the bridge circuit has been here described as controlling distortion, it will be apparent to those skilled in the art that the output might alternatively be applied to an indicating device, such as a meter.

While I have shown and described certain embodiments of my invention, it is to be understood that many variations thereof will be apparent to those skilled in the art, and therefore I am limited only by the scope of the hereunto appended claims.

Having now shown and described my invention, what I particularly claim and desire to secure by Letters Patent of the United States of America is as follows:

1. A distortion limiter for multi-stage electronic tube amplifiers, including means for feeding to the input of the amplifier an amplitude modulated signal of varying intensity, transducing means connected to the output of the amplifier, means of potentiometric type including a resistor effectively bridging two points of the amplifier which normally carry signals of similar form, but having unequal amplitudes related at a substantially constant ratio, said resistor and the respective paths to earth of the two exremities thereof, via said electronic tubes and the impedances connected thereto, constituting a Wheatstone type of bridge, the cross arm of said bridge comprising a connection taken from said resistor at a point of the resistor predetermined to be normally balanced with respect to undistorted signals, but carrying a potential when the bridge is unbalanced by distorted signals, means for rectifying and filtering said potential derived from said connection, and further means for feeding the continuous-current energy derived from said potential, due to unbalance, to a relatively earlier volume control point of said amplifier, in such phase as to reduce the volume, and consequently the distortion, in proportion to the increase of said potential of unbalance.

2. In an amplifier of the electronic tube type wherein the tube cathodes are earthed, having at least two stages of amplification, the input points whereof are arranged to be fed with an amplitude modulated signal current, said modulation being at audio-frequency, the output points whereof are arranged to feed de-modulated and amplified signals to a transducer, and the output tube whereof distorts the signal current fed thereto when the intensity of the signals exceeds a predetermined value, a distortion limiter characerized by the inclusion in said amplifier of a potentiometer connected between two points of said amplifier which both carry signal currents of normally similar form but of differing amplitudes, a connection to said potentiometer at a point thereof which is substantially at zero potential with respect to earth when said last-mentioned currents persist of similar form, rectifying means interposed between said connection and earth, a filter connected to the output of said rectifying means so as to suppress the signal components of the rectified output, and a connection from the output of said filter to a point at the input of said amplifier whereof the steady-state potential controls the effective degree of amplification of said amplifier, whereby overloading of said output tube causes dissimilarity of said normally similar signals, shifts along said potentiometer said zero point away from the point of connection to the potentiometer of said rectifying means, causes delivery from said filter to said input control point of a substantially continuous-current type of controlling potential, and thereby reduces said degree of amplification upon occurrence of incipient distortion of the output to said transducer, when said output tube commences to be overloaded by said signal current.

3. A distortion limiter as claimed in claim 1, wherein said resistor bridges anodes of successive amplifier stages and means whereby said feed-back control energy governs the grid-cathode potential of a stage of said amplifier earlier than the stages to which said resistor is connected.

4. A distortion limiter according to claim 1, including means for effectively connecting said bridge between the grid and the anode of the output tube of said amplifier.

5. A distortion limiter according to claim 1, including a volume expander and control element thereof, connected to the input tube of said amplifier, and including connections for feeding said derived energy to said control element of said volume expander.

6. A distortion limiter according to claim 1, including coupling capacitors connecting said resistor across said first-mentioned two points.

GEORGE A. BONADIO.

REFERENCES CITED

The following references are of record in the file of this patent:

UNITED STATES PATENTS

| Number | Name | Date |
|---|---|---|
| 1,834,002 | Nyquist | Dec. 1, 1931 |
| 2,161,418 | Jones | June 6, 1939 |
| 2,178,072 | Fritzinger | Oct. 31, 1939 |
| 2,379,699 | Ford | July 3, 1945 |
| 2,383,888 | Price | Aug. 28, 1945 |
| 2,480,842 | Farnsworth | Sept. 6, 1949 |